United States Patent
Sui et al.

(10) Patent No.: US 11,309,445 B2
(45) Date of Patent: Apr. 19, 2022

(54) THIN-FILM PHOTOVOLTAIC CELL SERIES STRUCTURE AND PREPARATION PROCESS OF THIN-FILM PHOTOVOLTAIC CELL SERIES STRUCTURE

(71) Applicant: TRUWIN OPTO-ELECTRONICS LIMITED, Guang Dong (CN)

(72) Inventors: Bin Sui, Guangdong (CN); Weicang Zhang, Guangdong (CN); Yun Zhao, Guangdong (CN); Yuan Li, Guangdong (CN); Wenjin Zhang, Guangdong (CN); Liang Yang, Guangdong (CN)

(73) Assignee: TRUWIN OPTO-ELECTRONICS LIMITED, Guang Dong (CN)

( * ) Notice: Subject to any disclaimer, the term of this patent is extended or adjusted under 35 U.S.C. 154(b) by 0 days.

(21) Appl. No.: 16/770,954

(22) PCT Filed: Jun. 3, 2019

(86) PCT No.: PCT/CN2019/089811
§ 371 (c)(1),
(2) Date: Jun. 9, 2020

(87) PCT Pub. No.: WO2020/237697
PCT Pub. Date: Dec. 3, 2020

(65) Prior Publication Data
US 2021/0074870 A1 Mar. 11, 2021

(30) Foreign Application Priority Data

May 31, 2019 (CN) .......................... 201910471589.6

(51) Int. Cl.
*H01L 31/0465* (2014.01)
*H01L 31/0224* (2006.01)
*H01L 31/18* (2006.01)

(52) U.S. Cl.
CPC .. *H01L 31/0465* (2014.12); *H01L 31/022441* (2013.01); *H01L 31/186* (2013.01)

(58) Field of Classification Search
CPC ......... H01L 31/0465; H01L 31/022441; H01L 31/186; H01L 31/022425; H01L 31/202;
(Continued)

(56) References Cited

U.S. PATENT DOCUMENTS

2010/0258159 A1* 10/2010 Hong .................... H01L 31/202
136/244
2017/0162812 A1* 6/2017 Aoki .................... H01L 51/441

FOREIGN PATENT DOCUMENTS

CN 104124288 10/2014
JP S6288989 6/1987
(Continued)

OTHER PUBLICATIONS

"International Search Report (Form PCT/ISA/210) of PCT/CN2019/089811," dated Mar. 6, 2020, pp. 1-5.
(Continued)

*Primary Examiner* — Lindsey A Bernier
(74) *Attorney, Agent, or Firm* — JCIP Global Inc.

(57) ABSTRACT

A thin-film photovoltaic cell series structure is disposed on a display surface side of a display module and includes a transparent substrate, as well as a first single-junction cell and a second single-junction cell which are disposed on the transparent substrate and connected in series. The first single-junction cell includes a first front electrode, a first photovoltaic layer, and a first back electrode which are sequentially laminated and disposed on the transparent substrate, the second single-junction cell includes a second front electrode, a second photovoltaic layer, and a second back electrode which are sequentially laminated and disposed on the transparent substrate, and the first front electrode and the
(Continued)

second back electrode are electrically connected through a metal auxiliary electrode to realize series connection of the first single-junction cell and the second single-junction cell.

9 Claims, 4 Drawing Sheets

(58) Field of Classification Search
CPC ............. H01L 31/0468; H01L 31/1804; H01L 31/0516; H01L 31/18; Y02E 10/547; Y02E 10/548
See application file for complete search history.

(56) References Cited

FOREIGN PATENT DOCUMENTS

| JP | H0196588 | 4/1989 |
| JP | H09266320 | 10/1997 |

OTHER PUBLICATIONS

"Written Opinion of the International Searching Authority (Form PCT/ISA/237) of PCT/CN2019/089811," dated Mar. 6, 2020, with English translation thereof, pp. 1-6.

* cited by examiner

D-D

E-E

THIN-FILM PHOTOVOLTAIC CELL SERIES STRUCTURE AND PREPARATION PROCESS OF THIN-FILM PHOTOVOLTAIC CELL SERIES STRUCTURE

CROSS-REFERENCE TO RELATED APPLICATION

This application is a 371 of international application of PCT application serial no. PCT/CN2019/089811, filed on Jun. 3, 2019, which claims the priority benefit of China application no. 201910471589.6, filed on May 31, 2019. The entirety of each of the abovementioned patent applications is hereby incorporated by reference herein and made a part of this specification.

BACKGROUND

Technical Field

The present disclosure relates to the technical field of manufacturing of thin-film photovoltaic cells, and more specifically to a thin-film photovoltaic cell series structure and a preparation process of the thin-film photovoltaic cell series structure.

Description of Related Art

With the increasing demand of people for energy and the continuous development of thin-film photovoltaic cell technologies, thin-film photovoltaic cells are applied to display modules (for example, wearable electronic products), and the technology of supplying power to the display modules by using the principle of photoelectric conversion is getting more and more widely used. At present, solar energy has few applications in wearable and low-power products with low power consumption, and a manufacturing process is cumbersome.

In addition, as wearable electronic products are not only used outdoors or in strong light environments, but also used indoors or in weak light environments more often, how to improve the photoelectric conversion efficiency in the weak light environments has become one of technical problems to be solved urgently in thin-film photovoltaic cell manufacturing technologies.

SUMMARY

In order to solve the deficiencies of the prior art, the present disclosure provides a thin-film photovoltaic cell series structure and a preparation process of the thin-film photovoltaic cell series structure. By adopting a metal auxiliary electrode between a first single junction cell and a second single-junction cell of a series structure for electrical connection, the metal auxiliary electrode on the one hand realizes the function of series connection, and on the other hand can realize the function of reducing a resistance of a front electrode, and the two functions effectively improve the conversion efficiency of a cell device.

The technical effects to be achieved by the present disclosure are achieved by the following solution: a thin-film photovoltaic cell series structure is disposed on a display surface side of a display module and includes a transparent substrate, as well as a first single junction cell and a second single junction cell which are disposed on the transparent substrate and connected in series, wherein the first single-junction cell includes a first front electrode, a first photovoltaic layer, and a first back electrode which are sequentially laminated and disposed on the transparent substrate, the second single junction cell includes a second front electrode, a second photovoltaic layer, and a second back electrode which are sequentially laminated and disposed on the transparent substrate, and the first front electrode and the second back electrode are electrically connected through a metal auxiliary electrode to realize series connection of the first single junction cell and the second single-junction cell.

Preferably, a total gate electrode connecting the first front electrode and the second front electrode is further formed on a periphery of the thin-film photovoltaic cell series structure.

Preferably, the first photovoltaic layer and the first back electrode are covered and insulated by an insulating layer, and a first metal auxiliary electrode is also contact-connected on the first front electrode.

Preferably, a second metal auxiliary electrode is further disposed on the second back electrode, and the second metal auxiliary electrode extends as a negative electrode and is in contact connection with the first metal auxiliary electrode used as a positive electrode of the first single-junction cell to realize the series connection of the first single-junction cell and the second single junction cell.

Preferably, the first photovoltaic layer and the first back electrode are covered and insulated by an insulating layer, a first metal auxiliary electrode is also contact-connected on the first front electrode, and the first metal auxiliary electrode leads out the first front electrode through a via hole to form a positive electrode and extends the first front electrode to cover the insulating layer.

Preferably, a second metal auxiliary electrode is further disposed on the second back electrode, and the second metal auxiliary electrode extends as a negative electrode and is in contact connection with the first metal auxiliary electrode of the first single-junction cell to realize the series connection of the first single-junction cell and the second single-junction cell.

Preferably, a third metal auxiliary electrode is further included in the first single junction cell, the third metal auxiliary electrode is in contact with the first front electrode, and the third metal auxiliary electrode is insulated and spaced apart from the first back electrode.

Preferably, a third metal auxiliary electrode may further be included in the second single junction cell, the third metal auxiliary electrode is in contact with the second front electrode, and the third metal auxiliary electrode is insulated and spaced apart from the second back electrode.

A preparation process of a thin-film photovoltaic cell series structure includes the following steps:

Step S1: providing a transparent substrate and performing film-forming of a first front electrode and a second front electrode on one side of the transparent substrate toward a display module;

Step S2: performing chemical vapor deposition film-forming of a first photovoltaic layer on the first front electrode and performing chemical vapor deposition film-forming of a second photovoltaic layer on the second front electrode;

Step S3: performing film-forming of a first back electrode on the first photovoltaic layer and performing film-forming of a second back electrode on the second photovoltaic layer;

Step S4: performing etched imaging on the first back electrode and the second back electrode after washing, and performing etched imaging on the first photovoltaic layer and the second photovoltaic layer after washing;

Step S5: performing photoresist coating and exposed imaging on the first front electrode and the second front electrode, then performing chemical etching and then removing a photoresist;

Step S6: performing film-forming on an insulating layer; and

Step S7: imaging a first metal auxiliary electrode and a second metal auxiliary electrode after photoresist coating and exposing, and performing chemical etching.

Preferably, Step S7 further includes the steps of imaging a third metal auxiliary electrode after photoresist coating and exposing and performing chemical etching.

The present disclosure has the following advantages:

1. by adopting a metal auxiliary electrode between a first single junction cell and a second single junction cell of the series structure for electrical connection, the metal auxiliary electrode on one hand realizes the function of series connection, and on the other hand may realize the function of reducing the resistance of a front electrode, and the two functions effectively improve the conversion efficiency of a cell device; and 2. by respectively and additionally disposing the third metal auxiliary electrode in the first single-junction cell and the second single-junction cell, the resistance of the front electrode is further reduced, and the conversion efficiency of the device is further improved.

DESCRIPTION OF THE EMBODIMENTS

Figure 1:
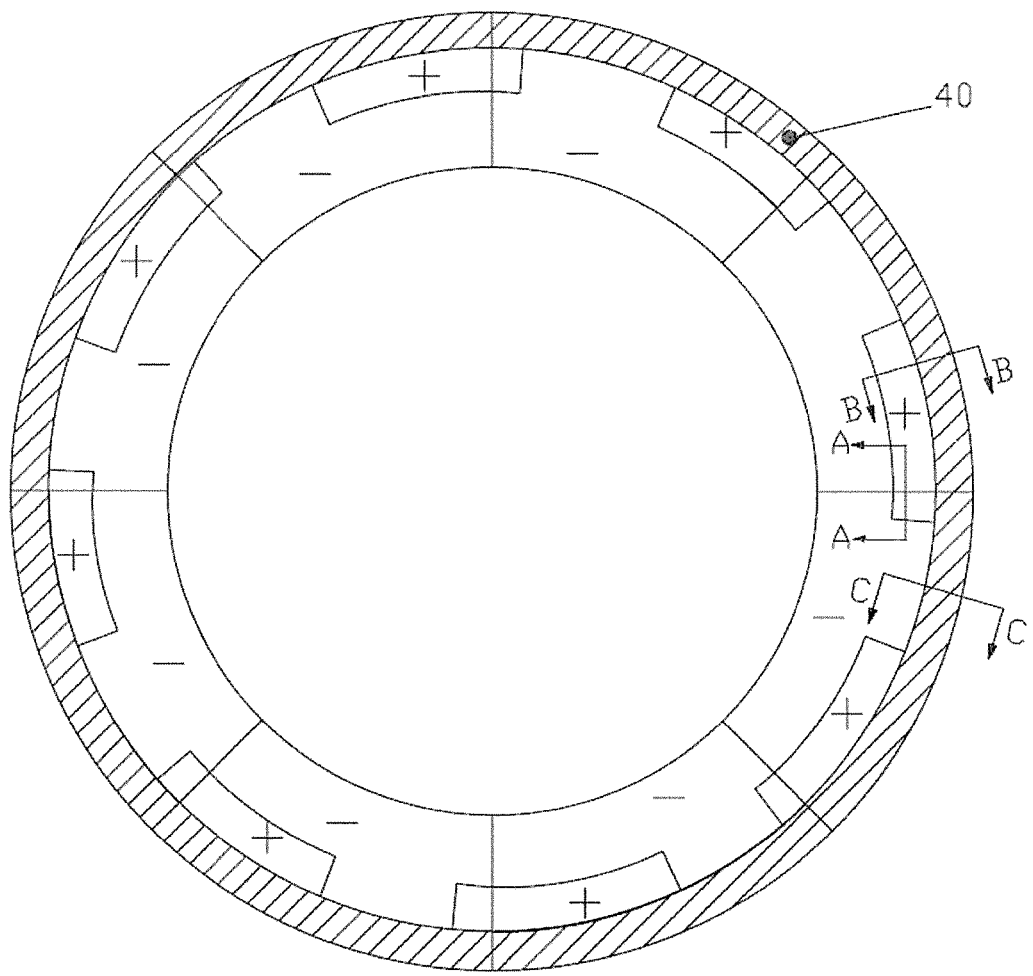
FIG. 1 is a schematic diagram of a plane structure of a thin-film photovoltaic cell series structure in Embodiment 1 of the present disclosure.

The present disclosure will be described in detail below with reference to the drawings and embodiments. Examples of the embodiments are shown in the drawings, in which the same or similar reference numerals indicate the same or similar elements or elements with the same or similar functions from beginning to end. The embodiments described below with reference to the drawings are exemplary, and are intended to explain the present disclosure, and should not be construed as limiting the present disclosure.

In the description of the present disclosure, it should be understood that the direction or positional relations indicated by the terms "length", "width", "up", "down", "front", "back", "left", "right", "vertical", "horizontal", "top", "bottom", "inside", "outside", etc. are the direction or positional relations shown on the basis of the drawings. They are merely used for facilitating the description of the present disclosure and simplifying the description, rather than indicating and implying that the indicated device or the element must have the specific direction, as well as be constructed and operated in the specific direction. Thus, they cannot be construed as limiting the present disclosure.

In addition, the terms "first", "second", and "third" are merely used for description, and cannot be understood as indicating or implying relative importance or implicitly indicating the number of indicated technical features. Thus, features defined as "first", "second", and "third" may explicitly or implicitly include one or more of the features. In the description of the present disclosure, the meaning of "a plurality of" refers to two or more, unless otherwise specifically defined.

In the present disclosure, unless otherwise clearly specified and defined, the terms "installation", "connected", "connection", "fixed", "disposed" and the like should be understood in a broad sense, for example, it may be fixedly connected, detachably connected or integrated; may be mechanically connected or electrically connected; may be directly connected or be indirectly connected through an intermediate medium; and may also refer to the communication in two elements or the interaction relationship between two elements. Those of ordinary skilled in the art may understand the specific meanings of the above terms in the present disclosure according to specific situations.

Embodiment 1

Embodiment 1 of the present disclosure provides a thin-film photovoltaic cell series structure, and the thin-film photovoltaic cell series structure is disposed on a display surface side of a display module and utilizes light energy for power generation, so as to charge the display module.

Figure 2:
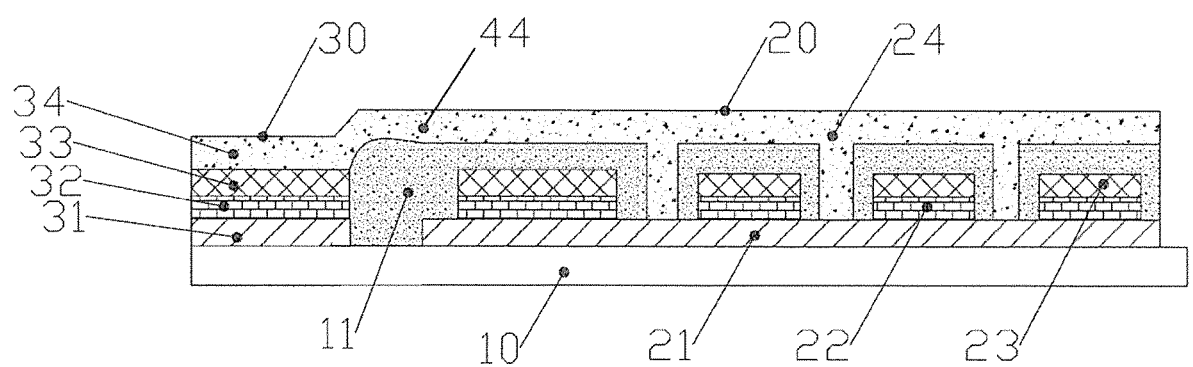
FIG. 2 is a schematic diagram of a sectional structure at A-A in FIG. 1 (showing a laminated structure of a first single junction cell and a second single-junction cell which are connected in series)

Referring to FIGS. 1 and 2, the thin-film photovoltaic cell series structure of the embodiment of the present disclosure includes a transparent substrate 10, as well as a first single junction cell 20 and a second single-junction cell 30 which are disposed on the transparent substrate 10 and connected in series, wherein the first single-junction cell 20 includes a first front electrode 21, a first photovoltaic layer 22, and a first back electrode 23 which are sequentially laminated and disposed on the transparent substrate 10, the second single junction cell 30 includes a second front electrode 31, a second photovoltaic layer 32, and a second back electrode 33 which are sequentially laminated and disposed on the transparent substrate 10, and the first front electrode 21 and the second back electrode 33 are electrically connected through a metal auxiliary electrode to realize series connection of the first single junction cell 20 and the second single junction cell 30. The metal auxiliary electrode serves as a series connection line between the first front electrode 21 and the second front electrode 31, mainly realizing a series connection function and also realizing the function of reducing the resistance.

Specifically, taking the circular display module as an example, it should be understood that the shape of the display module is not specifically limited, and may be circular, square or in any other shape.

The display module includes an intermediate display area (corresponding to the inner circle portion of FIG. 1) and a peripheral border area (corresponding to the outer ring portion of FIG. 1). The thin-film photovoltaic cell series structure is mainly disposed corresponding to the border area of the display module. Of course, thin-film photovoltaic cells may also be correspondingly disposed in the display area of the display module. However, the arrangement of the thin-film photovoltaic cells can affect the display effect of the display module, that is, affect a transmittance of the display module. Thus, the thin-film photovoltaic cells which are generally correspondingly disposed in the display area are in the shape of spaced grids, thereby being invisible to naked eyes, and preventing the thin-film photovoltaic cells from affecting the display effect of the display module. Thus, the photovoltaic conversion efficiency of the thin-film photovoltaic cells in the display area is much lower than that in the border area.

In the embodiment of the present disclosure, the thin-film photovoltaic cell series structure can completely cover the border area of the display module to improve the photovoltaic conversion efficiency without affecting the display effect of the display module. As shown in FIG. 1, the diagram of Embodiment 1 of the present disclosure illustrates a first implementation of a series structure of 8 single-junction cells (the number of 8 is only an example and should not be limited to this), each single-junction cell contains a positive electrode (+) and a negative electrode (−), the positive electrode of one single junction cell (equivalent to the front electrode of the first single junction cell 20) extends to the negative electrode of another adjacent single junction cell (equivalent to the back electrode of the second single junction cell 30) for electrical connection, so as to form the series connection.

Preferably, a total gate electrode 40 connecting the first front electrode 21 and the second front electrode 31 is further formed on a periphery of the thin-film photovoltaic cell series structure, and the total gate electrode 40 serves as a connecting bus of the positive electrode.

Figure 3:
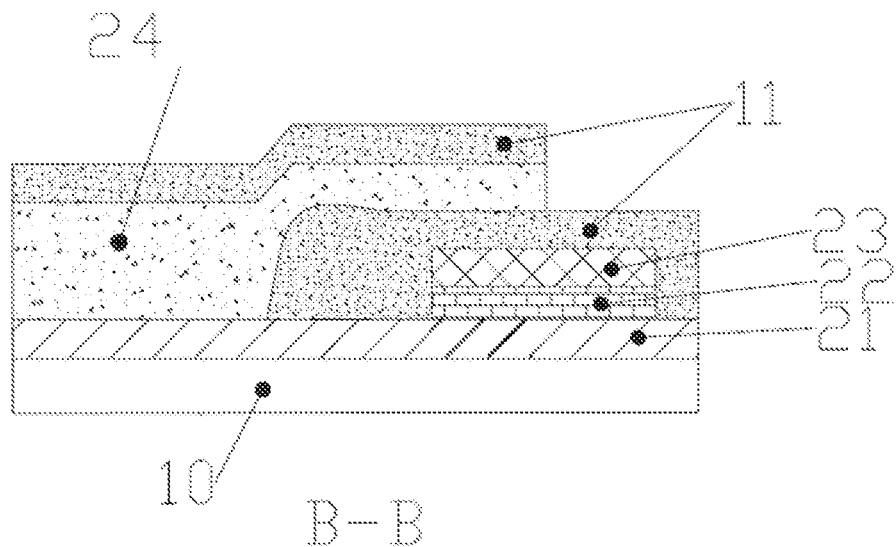
FIG. 3 is a schematic diagram of a sectional structure at B-B in FIG. 1 (showing a laminated structure of a positive electrode of the first single-junction cell)

As shown in FIG. 3, it is a sectional schematic diagram of a positive electrode structure of the first single junction cell 20 in FIG. 1 (at B-B). The first front electrode 21 is disposed on the transparent substrate 10, the first photovoltaic layer 22 and the first back electrode 23 are sequentially disposed on the first front electrode 21, the first photovoltaic layer 22 and the first back electrode 23 are covered and insulated by an insulating layer 11, and a first metal auxiliary electrode 24 is further contact-connected on the first front electrode 21 (the left side in FIG. 3 corresponds to the outer side of FIG. 1, and the left portion of the first metal auxiliary electrode 24 encloses to form the total gate electrode 40).

The first metal auxiliary electrode 24 in FIG. 3 has the following functions: 1. as the resistance of the first front electrode 21 is too large, it is not suitable for being directly used as an electrode, the first front electrode 21 is in contact connection with the first metal auxiliary electrode 24 and is led out for serving as the positive electrode, and the positive electrode is connected with the negative electrode of the adjacent second single junction cell 30; 2. the first metal auxiliary electrode 24 further has the functions of reducing the resistance of the first front electrode 21 to a certain extent and improving the efficiency of the device; and 3. when film-forming of the first metal auxiliary electrode 24 is performed, it needs to extend into the ring (the second metal auxiliary electrode in FIG. 3 extends to the right), and the first metal auxiliary electrode 24 of the extended portion as the positive electrode is connected with the negative electrode of the adjacent second single junction cell 30 to form a series structure.

Figure 4:
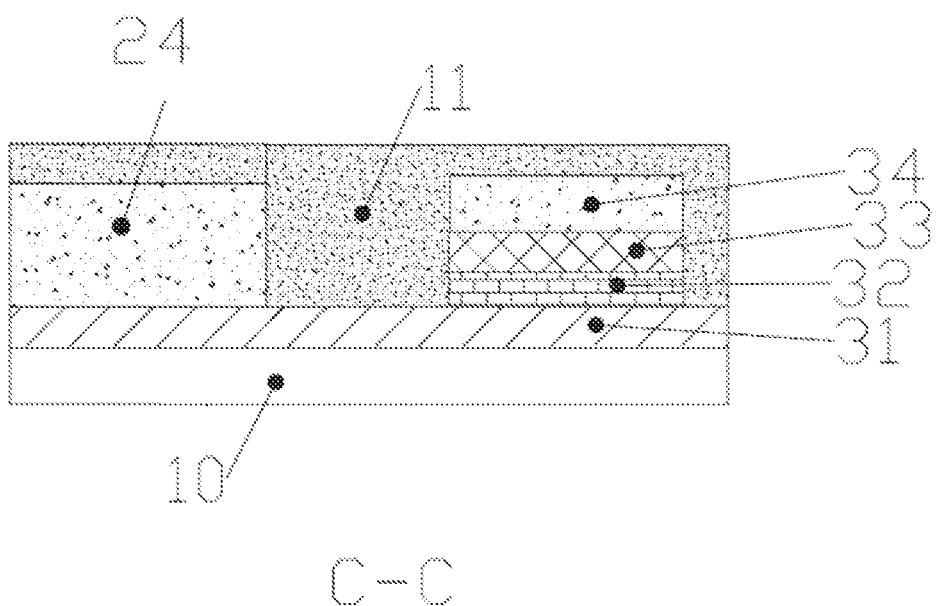
FIG. 4 is a schematic diagram of a sectional structure at C-C in FIG. 1 (showing a laminated structure of a negative electrode of the second single-junction cell)

As shown in FIG. 4, it is a sectional schematic diagram of the second single-junction cell 30 in FIG. 1 (at C-C). The second front electrode 31 is disposed on the transparent substrate 10, the second photovoltaic layer 32 and the second back electrode 33 are sequentially disposed on the second front electrode 31, a second metal auxiliary electrode 34 is further disposed on the second back electrode 33, and the second metal auxiliary electrode 34 as the negative electrode extends to be in contact connection with the first metal auxiliary electrode 24 as the positive electrode of the first single-junction cell 20 to realize the series connection of the first single junction cell 20 and the second single-junction cell 30.

The first metal auxiliary electrode 24 is further independently contact-connected on the second front electrode 31 as the positive electrode of the second single junction cell 30, and the first metal auxiliary electrode 24 is insulated and spaced apart from the second metal auxiliary electrode 34 and the second back electrode 33 to prevent short-circuiting of the connection.

By analogy, the positive electrode of the second single-junction cell 30 is connected with the negative electrode of the next first single-junction cell 20, thereby sequentially connecting all the single-junction cells in series to form a loop.

Embodiment 2

Figure 5:
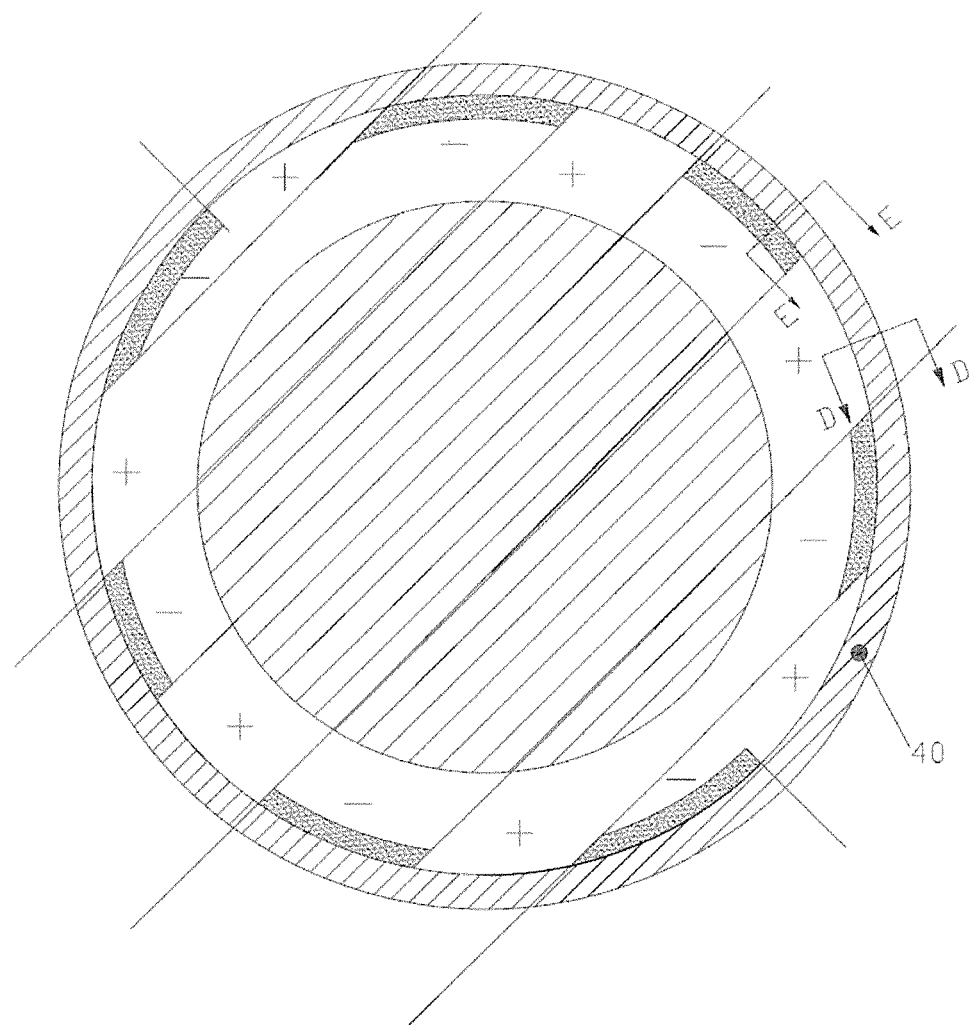
FIG. 5 is a schematic diagram of a plane structure of a thin-film photovoltaic cell series structure in Embodiment 2 of the present disclosure.

As shown in FIG. 5, the diagram of Embodiment 2 of the present disclosure illustrates a second implementation of a series structure of 7 single junction cells (for the sake of clear illustration, a dividing line L is drawn in FIG. 5, one end of the dividing line L exceeding the outer circle portion is a dividing end, and one end of the dividing line L contracting in the outer circle portion is a series connection end). Corresponding to a display area of a display module, the thin-film photovoltaic cell series structure further includes thin-film photovoltaic cells (shown as grids in the drawing) disposed in the display area. At this time, the thin-film photovoltaic cells in the display area and thin-film photovoltaic cells in the border area may be divided according to an entire area to form an S-shaped series structure.

Figure 6:
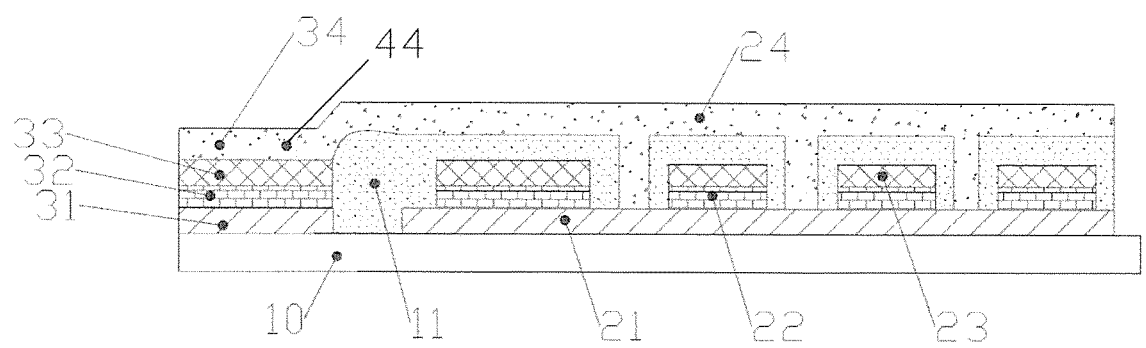
FIG. 6 is a schematic diagram of a sectional structure at D-D in FIG. 5 (showing the laminated structure of the positive electrode of the first single junction cell)

As shown in FIG. 6, it is a sectional schematic diagram embodying the first single junction cell 20 in FIG. 5 (at D-D). The first front electrode 21 is disposed on the transparent substrate 10, the first photovoltaic layer 22 and the first back electrode 23 are sequentially disposed on the first front electrode 21, the first photovoltaic layer 22 and the first back electrode 23 are covered and insulated by an insulating layer 11, a first metal auxiliary electrode 24 is further contact-connected on the first front electrode 21, the first metal auxiliary electrode 24 leads out the first front electrode 21 through a via hole to form a positive electrode and extends the first front electrode 21 to cover the insulating layer 11, the first metal auxiliary electrode 24 is connected to an outermost second metal auxiliary electrode 34, and the positive electrode and the negative electrode are connected by connecting the first metal auxiliary electrode 24 and the second metal auxiliary electrode 34. The via hole may have a plurality of irregular shapes.

Figure 7:
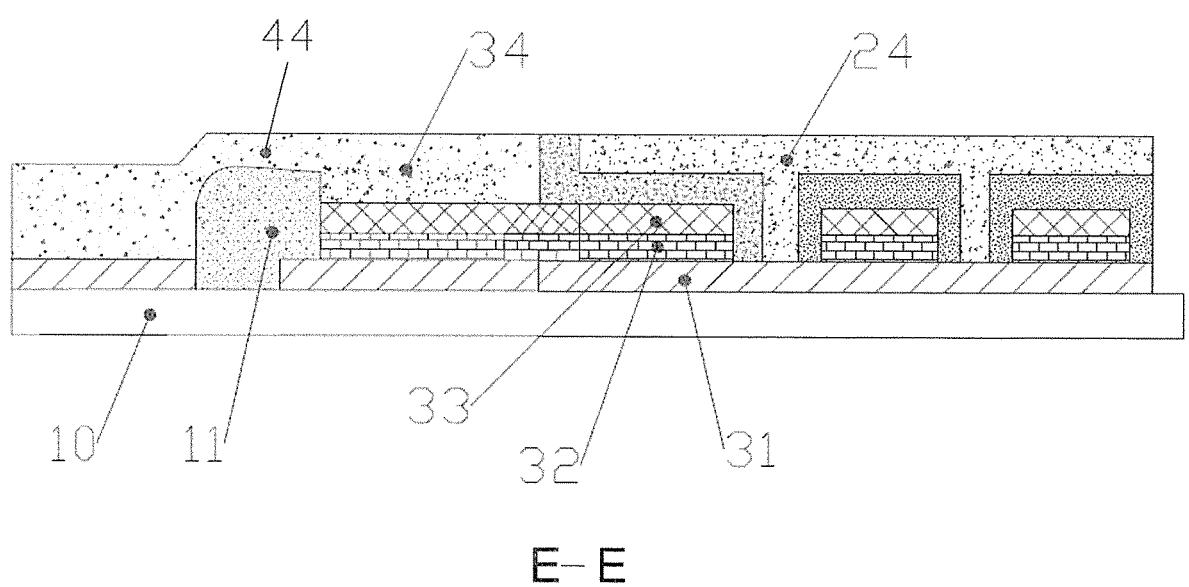
FIG. 7 is a schematic diagram of a sectional structure at E-E in FIG. 5 (showing the laminated structure of the negative electrode of the second single junction cell).

As shown in FIG. 7, it is a sectional schematic diagram embodying the second single junction cell 30 in FIG. 5 (at E-E). The second front electrode 31 is disposed on the transparent substrate 10, the second photovoltaic layer 32 and the second back electrode 33 are sequentially disposed on the second front electrode 31, a second metal auxiliary electrode 34 is further disposed on the second back electrode 33, and the second metal auxiliary electrode 34 as the negative electrode extends to be in contact connection with the first metal auxiliary electrode 24 of the first single junction cell 20.

It should be understood that a photovoltaic layer may also be disposed between the outermost metal auxiliary electrode and the front electrode, so that the color of the metal auxiliary electrode on the light incident surface is consistent with that in other photovoltaic conversion areas. As only when the front electrode is in direct contact with the metal auxiliary electrode, the color of the surface can reflect the color of metal, not the color of the photovoltaic layer.

As a further improvement of the above two embodiments of the present disclosure, a third metal auxiliary electrode 44 may further be included in the first single-junction cell 20, the third metal auxiliary electrode 44 is in contact with the first front electrode 21 for reducing the resistance of the front electrode, and the third metal auxiliary electrode 44 is insulated and spaced apart from the first back electrode 23 to prevent short-circuiting of the connection between the first front electrode 21 and the first back electrode 23.

As a further improvement of the above two embodiments of the present disclosure, a third metal auxiliary electrode may further be included in the second single junction cell 30, the third metal auxiliary electrode is in contact with the second front electrode 31 for reducing the resistance of the front electrode, and the third metal auxiliary electrode is insulated and spaced apart from the second back electrode 33 to prevent short-circuiting of the connection between the second front electrode 31 and the second back electrode 33.

An area of the connection portion between the third metal auxiliary electrode and the front electrode can be determined according to actual conditions, which can prevent the excessive resistance of the front electrode from affecting the photovoltaic conversion efficiency and thus improve the efficiency of the single junction cell. The connection portion between the third metal auxiliary electrode and the front electrode can refer to the connection portion between the first metal auxiliary electrode and the first front electrode, so it is not shown in the present disclosure.

Corresponding to the display area of the display module, the thin-film photovoltaic cell series structure may be additionally provided with structures in different shapes, such as line type cells or honeycomb cells, which are invisible to the naked eyes, to form a translucent structure, the structures may be arbitrarily cut off in certain positions, for example, the middle part is the line, then the line may also be disconnected at the middle or ⅓ of the line, and the two ends of the line are respectively connected on the series cells in the border area and respectively form a single cell with the connected cells in the border area.

Preferably, the third metal auxiliary electrode may be at least partially formed on the lower surface of the first front electrode 21 and/or the second front electrode 31, and the third metal auxiliary electrode may be formed on one side or two sides of the first front electrode 21 to improve the efficiency of reducing the resistance, and/or be formed on one side or two sides of the second front electrode 31 to improve the efficiency of reducing the resistance.

Preferably, due to strong reflection, the third metal auxiliary electrode causes more light reflection on the light incident surface. In order to reduce such phenomenon, an anti-reflection layer is further disposed on the lower surface of the third metal auxiliary electrode respectively. The anti-reflection layer may adopt a SiNx material or use a black metal material, such as molybdenum oxide and the like for covering the third metal auxiliary electrode and reducing the light reflection when the thin-film photovoltaic cell series structure is used.

As another improvement of the above two embodiments, the third metal auxiliary electrode is formed on the upper surface of the first front electrode 21, and/or the third metal auxiliary electrode is formed on the upper surface of the second front electrode 31. The insulating layers 11 are also respectively disposed between the third metal auxiliary electrode and the first back electrode 23, as well as between the third metal auxiliary electrode and the second back electrode 33. The disposing range of the third metal auxiliary electrode is not specifically limited. The broader the disposing range is, the better the effect of reducing the resistance.

In an embodiment of the present disclosure, the first front electrode 21, the first back electrode 23, the second front electrode 31, and the second back electrode 33 may be directly used as electrodes without adding other materials with good conductivity, such as silver paste, thereby shortening the process flow and increasing the product yield.

In an embodiment of the present disclosure, the shape structure formed by the thin-film photovoltaic cell series structure may change according to the shape needs of the device, which is not limited to the circular ring shape illustrated in the present disclosure, and may also be square or polygonal and the like.

In an embodiment of the present disclosure, the first metal auxiliary electrode 24, the total gate electrode 40, the first metal auxiliary electrode 24, and the first metal auxiliary electrode 24 may adopt a metal oxide, such as aluminum-doped zinc oxide (AZO), indium tin oxide (ITO), or a laminate of metal oxides and metals for replacement, and the metal laminate is more conductive to film-forming of the electrode, thereby improving the efficiency of the thin-film photovoltaic cell series structure.

In an embodiment of the present disclosure, in order to ensure the transmittance of natural light, the first front electrode 21 and the second front electrode 31 may adopt high-transmittance metal oxides, such as AZO, ITO and SnO or transparent substances, such as graphene, carbon nano-tubes and nano-metals.

In an embodiment of the present disclosure, the first photovoltaic layer 22 and the second photovoltaic layer 32 may be different types of amorphous silicon, crystalline silicon, GaAs, copper indium gallium selenide (CIGS) formed by gas or a combination of various different photovoltaic layers to achieve the purpose of increasing the conversion rate.

In an embodiment of the disclosure, the first back electrode 23 and the second back electrode 33 may adopt Al, Mo, Ag, Cu, Au and other materials, or a combination of the metals, or the metal oxide, graphene and other materials which are the same as the front electrode 20.

The circular ring graphic area shown in the embodiment of the present disclosure does not show the electrode shape bound to FPC display, and the electrode shape may be designed according to actual needs.

Embodiment 3

Embodiment 3 of the present disclosure provides a preparation process of the thin-film photovoltaic cell series structure described in Embodiment 1 and Embodiment 2, including the following steps:

Step S1: a transparent substrate 10 is provided and film-forming of a first front electrode 21 and a second front electrode 31 is performed on one side of the transparent substrate 10 toward a display module.

Optionally, the process further includes a step of texturing the first front electrode 21 and the second front electrode 31 to form rough planes, so as to improve the absorption of solar energy.

Specifically, the first front electrode 21 and the second front electrode 31 may adopt one or a combination of AZO, ITO and other materials. When used in combination, AZO is in contact with a photovoltaic layer to reduce the contact resistance. Wherein, the film-forming temperature of the AZO is 200-350° C., and the film-forming thickness is between 300 nm-1000 nm; for ITO, film-forming may be performed at a normal temperature, the film thickness is 500 Å-3000 Å, preferably, the temperature of 235° C. or above is adopted, and annealing is performed to reduce the resistance of the ITO; and for the AZO, low-concentration HCl or alkaline substances may be selected for texturing to form a rough plane, so as to improve the absorption of solar energy.

Step S2: chemical vapor deposition film-forming of a first photovoltaic layer 22 is performed on the first front electrode 21 and chemical vapor deposition film-forming of a second photovoltaic layer 32 is performed on the second front electrode 31.

Specifically, the first photovoltaic layer 22 and the second photovoltaic layer 32 are divided into a P layer, an I layer, and an N layer respectively, wherein a thickness of the P layer is 10 nm-30 nm, and a film-forming temperature is 190° C.-210° C.; the I layer is 200 nm-500 nm, and a film-forming temperature is 190° C.-210° C.; and the N layer is 20 nm-30 nm, and a film-forming temperature is 170° C.-190° C. More preferably, the P layer is divided into a P1 layer and a P2 layer, wherein, P1 uses gas, namely B2H6, SiH4 and H2, B2H6:SiH4=1:2 or 1:2.5, the deposition pressure is 9000 mtorr, the pressure ensures P1 nanocrystalline silicon, the conductivity is good, the deposition power is 700 w-1400 w, and the adjustment is performed according to the actual film thickness. The hydrogen dilution ratio H2/SiH4=600; P2 uses B2H6, CH4, SiH4 and H2, B2H6:SiH4:CH4=1:3.75:2.5, the deposition pressure is 2500 mtorr, the deposition power is 80 w-140 w, and the hydrogen dilution ratio H2/SiH4=10. The I layer uses two gases, SiH4 and H2, with a ratio of 1:10, the deposition pressure is 2500 mtorr, and the deposition power is 30 w-500 w. N1 uses PH3, SiH4 and H2, PH3:SiH4=1:1.5, the deposition pressure is 1500 mtorr, and the deposition power is 90 w-120 w; and the hydrogen dilution ratio H2/SiH4=5.5. N2 uses PH3, SiH4 and H2, PH3:SiH4=4:3, the deposition pressure is 1500 mtorr, and the deposition power is 30-60 w; and the hydrogen dilution ratio H2/SiH4=8.

Step S3: film-forming of a first back electrode 23 is performed on the first photovoltaic layer 22 and film-forming of a second back electrode 33 is performed on the second photovoltaic layer 32. Preferably, the film-forming temperature of the first back electrode 23 and the second back electrode 33 is 40° C.-180° C., and the film thickness is 3000 Å-4000 Å.

Step S4: the first back electrode 23 and the second back electrode 33 are subjected to etched imaging after washing, and the first photovoltaic layer 22 and the second photovoltaic layer 32 are subjected to etched imaging after washing. In this step, an A1 etching solution may be first selected to etch and image the first back electrode 23 and the second back electrode 33; and then the A1 etching solution is put into a dry-etching machine for etching the first photovoltaic layer 22 and the second photovoltaic layer 32, gas (cl2:

SF6=10) is used, and Ar and SF6 may also be selected. Here, the main point is that the dry-etching is directly performed without demolding treatment of a photoresist before dry-etching, so that the process step is saved.

Step S5: photoresist coating and exposed imaging are performed on the first front electrode 21 and the second front electrode 31, then chemical etching is performed and then the photoresist is removed, preferably, imaging of the first front electrode 21 and the second front electrode 31 may be performed by chemical etching. Preferably, the width of the first front electrode 21 is greater than that of the first photovoltaic layer 22, and the width of the second front electrode 31 is greater than that of the second photovoltaic layer 32, so as to ensure the area of an effective photovoltaic conversion area.

Step S6: forming an insulating layer 11. The insulating layer 11 may adopt an organic material. The angle between the insulating layer 11 and the first front electrode 21, and the angle between the insulating layer 11 and the second front electrode 31 should be controlled within 80 degrees, thereby preventing the metal auxiliary electrode from being disconnected because the angle is too steep during film-forming.

In addition, the insulating layer 11 may be simultaneously disposed on a periphery of the first front electrode 21 to protect the first front electrode 21, and the insulating layer 11 may be simultaneously disposed on a periphery of the second front electrode 31 to protect the second front electrode 31. Because if the metal auxiliary electrode is chemically etched, an etching solution may etch away the front electrode, and the insulating layer 11 is configured to protect the front electrode from being etched.

Step S7: a first metal auxiliary electrode 24 and a second metal auxiliary electrode 34 are imaged after photoresist coating and exposing, and chemical etching is performed. The film-forming and etching parameters of the metal auxiliary electrode may be the same as those of any one of the front electrodes and the back electrodes.

As a further improvement of the embodiment of the present disclosure, Step S7 further includes the steps of imaging a third metal auxiliary electrode 44 after photoresist coating and exposing and performing chemical etching, and the third metal auxiliary electrode 44 is configured to reduce the resistance of the front electrode.

Preferably, a film layer structure of each of the first metal auxiliary electrode 24, the second metal auxiliary electrode 34 and the third metal auxiliary electrode 44 may be formed by sequentially laminating a first Mo layer, a metal layer and a second Mo layer, wherein the metal layer may adopt Al or Ag and other materials, the first Mo layer may improve the adhesion of the intermediate metal layer to the transparent substrate 10 (or the front electrode), the second Mo layer may realize a protecting function, and the second Mo layer may also use a metal with low activity, wherein the film-forming temperature of the first metal auxiliary electrode 24 and the second metal auxiliary electrode 34 is 40° C.-230° C., the thickness of the first Mo layer may be 500 Å, the thickness of the metal layer may be 2000 Å-5000 Å, and the thickness of the second Mo layer may be 500 Å. Due to strong reflection, the metal layer causes more light reflection on the light incident surface. In order to reduce such phenomenon, SiNx anti-reflection layers may further be plated on the first metal auxiliary electrode 24, the second metal auxiliary electrode 34 and the third metal auxiliary electrode 44 before film-forming, or the metal auxiliary electrodes are covered by using molybdenum oxide and other black metals, thereby reducing the light reflection when the thin-film photovoltaic cell series structure is used.

The first metal auxiliary electrode 24 and the second metal auxiliary electrode 34 may also be configured to reduce the resistance of a current loop, and maximize the efficiency of the thin-film photovoltaic cell series structure.

In the preparation process of the thin-film photovoltaic cell series structure described in Embodiment 3 of the present disclosure, the metal auxiliary electrodes are used for connecting the adjacent single junction cells in series and also reducing the resistance of the front electrodes; and by disposing the first auxiliary electrode in the first single junction cell 20 and disposing the second auxiliary electrode in the second single-junction cell 30, the resistance of the front electrodes is further reduced, and the efficiency of the device is effectively improved.

Finally, it should be noted that, the above embodiments are merely used for explaining the technical solutions of the embodiments of the present disclosure, rather than limiting the embodiments of the present disclosure. Although the embodiments of the present disclosure are described in detail with reference to the preferred embodiments, those of ordinary skilled in the art should understand that the technical solutions of the embodiments of the present disclosure may still be modified or be substituted equivalently, and the modifications or equivalent substitutions cannot make the technical solutions after modifications to depart from the scope of the technical solutions of the embodiments of the present disclosure either.

What is claimed is:

1. A thin-film photovoltaic cell series structure, that is disposed on a display surface side of a display module, characterized in that the thin-film photovoltaic cell series structure comprises a transparent substrate, as well as a first single-junction cell and a second single-junction cell which are disposed on the transparent substrate and connected in series, wherein the first single-junction cell comprises a first front electrode, a first photovoltaic layer, and a first back electrode which are sequentially laminated and disposed on the transparent substrate, the second single-junction cell comprises a second front electrode, a second photovoltaic layer, and a second back electrode which are sequentially laminated and disposed on the transparent substrate, the first front electrode and the second back electrode are electrically connected through a metal auxiliary electrode to realize series connection of the first single-junction cell and the second single-junction cell, the metal auxiliary electrode comprises a first metal auxiliary electrode and a second metal auxiliary electrode, a total gate electrode connecting the first front electrode and the second front electrode is further formed on a periphery of the thin-film photovoltaic cell series structure, the first photovoltaic layer and the first back electrode are covered and insulated by an insulating layer, and the first metal auxiliary electrode is also contact-connected on the first front electrode, and the first metal auxiliary electrode leads out the first front electrode through a via hole to form a positive electrode and extends to cover the insulating layer.

2. The thin-film photovoltaic cell series structure according to claim 1, characterized in that the second metal auxiliary electrode is further disposed on the second back electrode, and the second metal auxiliary electrode extends as a negative electrode and is in contact connection with the first metal auxiliary electrode used as a positive electrode of the first single-junction cell to realize the series connection of the first single-junction cell and the second single-junction cell.

3. The thin-film photovoltaic cell series structure according to claim 1, characterized in that the second metal auxiliary electrode is further disposed on the second back electrode, and the second metal auxiliary electrode extends as a negative electrode and is in contact connection with the first metal auxiliary electrode of the first single-junction cell to realize the series connection of the first single-junction cell and the second single-junction cell.

4. The thin-film photovoltaic cell series structure according to claim 1, characterized in that the metal auxiliary electrode further comprises a third metal auxiliary electrode, the third metal auxiliary electrode is further included in the first single-junction cell, the third metal auxiliary electrode is in contact with the first front electrode, and the third metal auxiliary electrode is insulated and spaced apart from the first back electrode.

5. The thin-film photovoltaic cell series structure according to claim 1, characterized in that the metal auxiliary electrode further comprises a third metal auxiliary electrode, the third metal auxiliary electrode is further included in the second single-junction cell, the third metal auxiliary electrode is in contact with the second front electrode, and the third metal auxiliary electrode is insulated and spaced apart from the second back electrode.

6. The thin-film photovoltaic cell series structure according to claim 2, characterized in that the metal auxiliary electrode further comprises a third metal auxiliary electrode, the third metal auxiliary electrode is further included in the first single-junction cell, the third metal auxiliary electrode is in contact with the first front electrode, and the third metal auxiliary electrode is insulated and spaced apart from the first back electrode.

7. The thin-film photovoltaic cell series structure according to claim 3, characterized in that the metal auxiliary electrode further comprises a third metal auxiliary electrode, the third metal auxiliary electrode is further included in the first single-junction cell, the third metal auxiliary electrode is in contact with the first front electrode, and the third metal auxiliary electrode is insulated and spaced apart from the first back electrode.

8. The thin-film photovoltaic cell series structure according to claim 2, characterized in that the metal auxiliary electrode further comprises a third metal auxiliary electrode, the third metal auxiliary electrode is further included in the second single-junction cell, the third metal auxiliary electrode is in contact with the second front electrode, and the third metal auxiliary electrode is insulated and spaced apart from the second back electrode.

9. The thin-film photovoltaic cell series structure according to claim 3, characterized in that the metal auxiliary electrode further comprises a third metal auxiliary electrode, the third metal auxiliary electrode is further included in the second single-junction cell, the third metal auxiliary electrode is in contact with the second front electrode, and the third metal auxiliary electrode is insulated and spaced apart from the second back electrode.

* * * * *